United States Patent
Orlowski et al.

(10) Patent No.: US 8,158,484 B2
(45) Date of Patent: Apr. 17, 2012

(54) METHOD OF FORMING AN INVERTED T SHAPED CHANNEL STRUCTURE FOR AN INVERTED T CHANNEL FIELD EFFECT TRANSISTOR DEVICE

(75) Inventors: Marius Orlowski, Meylan (FR); Andreas Wild, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 110 days.

(21) Appl. No.: 12/679,385

(22) PCT Filed: Oct. 3, 2007

(86) PCT No.: PCT/IB2007/055365
§ 371 (c)(1),
(2), (4) Date: Mar. 22, 2010

(87) PCT Pub. No.: WO2009/044236
PCT Pub. Date: Apr. 9, 2009

(65) Prior Publication Data
US 2010/0311213 A1    Dec. 9, 2010

(51) Int. Cl.
H01L 21/331 (2006.01)
H01L 21/8222 (2006.01)

(52) U.S. Cl. ............ 438/311; 438/9; 438/706; 438/745; 257/E21.014; 257/E21.051; 257/E21.115; 257/E21.218; 257/E21.227; 257/E21.229; 257/E21.32

(58) Field of Classification Search ............ 438/9, 197, 438/311, 513, 706, 745, 752, 753, 933; 257/E21.014, 51, 115, 218, 227, 229, 32
See application file for complete search history.

(56) References Cited

U.S. PATENT DOCUMENTS
6,064,085 A    5/2000    Wu
(Continued)

FOREIGN PATENT DOCUMENTS
WO    2007/050317 A    5/2007

OTHER PUBLICATIONS

Mathew L et al: "Inverted T Channel FET (ITFET)—Fabrication and Characteristics of Vertical-Horizontal, Thin Body, Multi-Gate, Multi-Orientation Devices, ITFET SRAM Bit-Cell Operation. A Novel Technology for 45nm and Beyond CMOS" Electron Devices Meeting, 2005. IEDM Technical Digest. IEEE International Dec. 5, 2005, Piscataway, NJ, USA, IEEE, pp. 713-716. V. Caubet: "Impact of Tunnel Etching Process on Electrical Performance of SON Devices" Japanese Journal of Applied Physics, 44 (2005) pp. 5795-5798.

(Continued)

Primary Examiner — David Nhu (57) ABSTRACT

A method of forming an inverted T shaped channel structure having a vertical channel portion and a horizontal channel portion for an Inverted T channel Field Effect Transistor ITFET device comprises providing a semiconductor substrate, providing a first layer of a first semiconductor material over the semiconductor substrate, and providing a second layer of a second semiconductor material over the first layer. The first and the second semiconductor materials are selected such that the first semiconductor material has a rate of removal which is less than a rate of removal of the second semiconductor material. The method further comprises removing a portion of the first layer and a portion of the second layer selectively according to the different rates of removal so as to provide a lateral layer and the vertical channel portion of the inverted T shaped channel structure and removing a portion of the lateral layer so as to provide the horizontal channel portion of the inverted T shaped channel structure.

20 Claims, 8 Drawing Sheets

U.S. PATENT DOCUMENTS

| | | | |
|---|---|---|---|
| 6,078,493 | A | 6/2000 | Kang |
| 6,413,802 | B1 * | 7/2002 | Hu et al. ............... 438/151 |
| 6,475,890 | B1 | 11/2002 | Yu |
| 6,630,712 | B2 * | 10/2003 | Yu ........................ 257/344 |
| 6,642,090 | B1 | 11/2003 | Fried et al. |
| 6,855,583 | B1 | 2/2005 | Krivokapic et al. |
| 7,323,373 | B2 * | 1/2008 | Mathew et al. ......... 438/156 |
| 7,452,768 | B2 * | 11/2008 | Min et al. ............... 438/238 |
| 2004/0262699 | A1 | 12/2004 | Rios et al. |
| 2006/0170066 | A1 | 8/2006 | Mathew et al. |
| 2007/0023756 | A1 | 2/2007 | Anderson et al. |
| 2007/0141763 | A1 | 6/2007 | Choi et al. |
| 2007/0221956 | A1 | 9/2007 | Inaba |

OTHER PUBLICATIONS

F. Boeuf: "16nm Planar NMOSFET Manufacturable Within State-of-the-Art CMOS Process Thanks to Specific Design and Optimisation" STMicroelectronics, F-38926 Crolles, France, IEEE 2001, pp. 29.5.1-29.5.4.

S. Monfray: "50nm—Gate All Around (GAA)—Silicon on Nothing (SON)—Devices: A Simple Way to Co-Integration of GAA Transistors Within Bulk MOSFET Process" STMicroelectronics, Crolles, France, IEEE 2002, pp. 108-109.

International Search Report and Written Opinion correlating to PCT/IB2007/055365 dated Apr. 4, 2008.

\* cited by examiner

METHOD OF FORMING AN INVERTED T SHAPED CHANNEL STRUCTURE FOR AN INVERTED T CHANNEL FIELD EFFECT TRANSISTOR DEVICE

CROSS-REFERENCE TO RELATED APPLICATION

This application is a National Stage Entry under 37 C.F.R. §371 of International Application No. PCT/IB2007/055365, filed Oct. 3, 2007, entitled "METHOD OF FORMING AN INVERTED T SHAPED CHANNEL STRUCTURE FOR AN INVERTED T CHANNEL FIELD EFFECT TRANSISTOR DEVICE," which is hereby expressly incorporated by reference in its entirety.

FIELD OF THE DISCLOSURE

This disclosure relates to method of forming an inverted T shaped channel structure for an Inverted T channel Field Effect Transistor (ITFET) device, a method of forming an ITFET device and an ITFET device.

BACKGROUND

Figure 1:
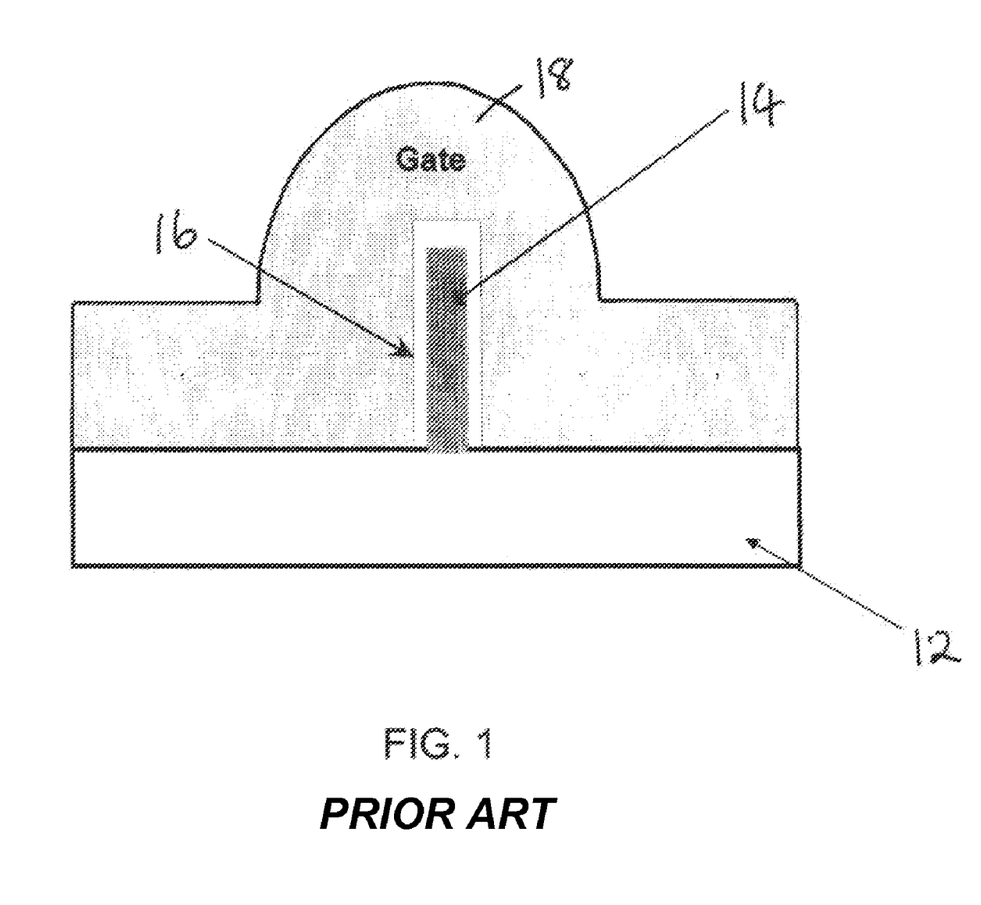
FIG. 1 is a schematic cross-section diagram of a portion of a known FinFET device.

New transistor device architectures such as double gate transistor devices have been developed to provide improved short channel control which results in improved current characteristics. A FinFET device is an example of such a double gate device. A simplified cross-section of part of a FinFET device is shown in FIG. 1. A FinFET device is a non-planar device which includes a conducting channel that is formed on the two opposite faces of or is wrapped around a thin silicon 'fin' 14 formed on a substrate 12 which forms the body of the device. A gate 18 overlies the fin 14 and a gate dielectric 16. The dimensions of the fin and the number of fins in the device determine the effective channel width of the device. The FinFET has some limitations due to the space between the fins being electrically inactive.

Figure 2:
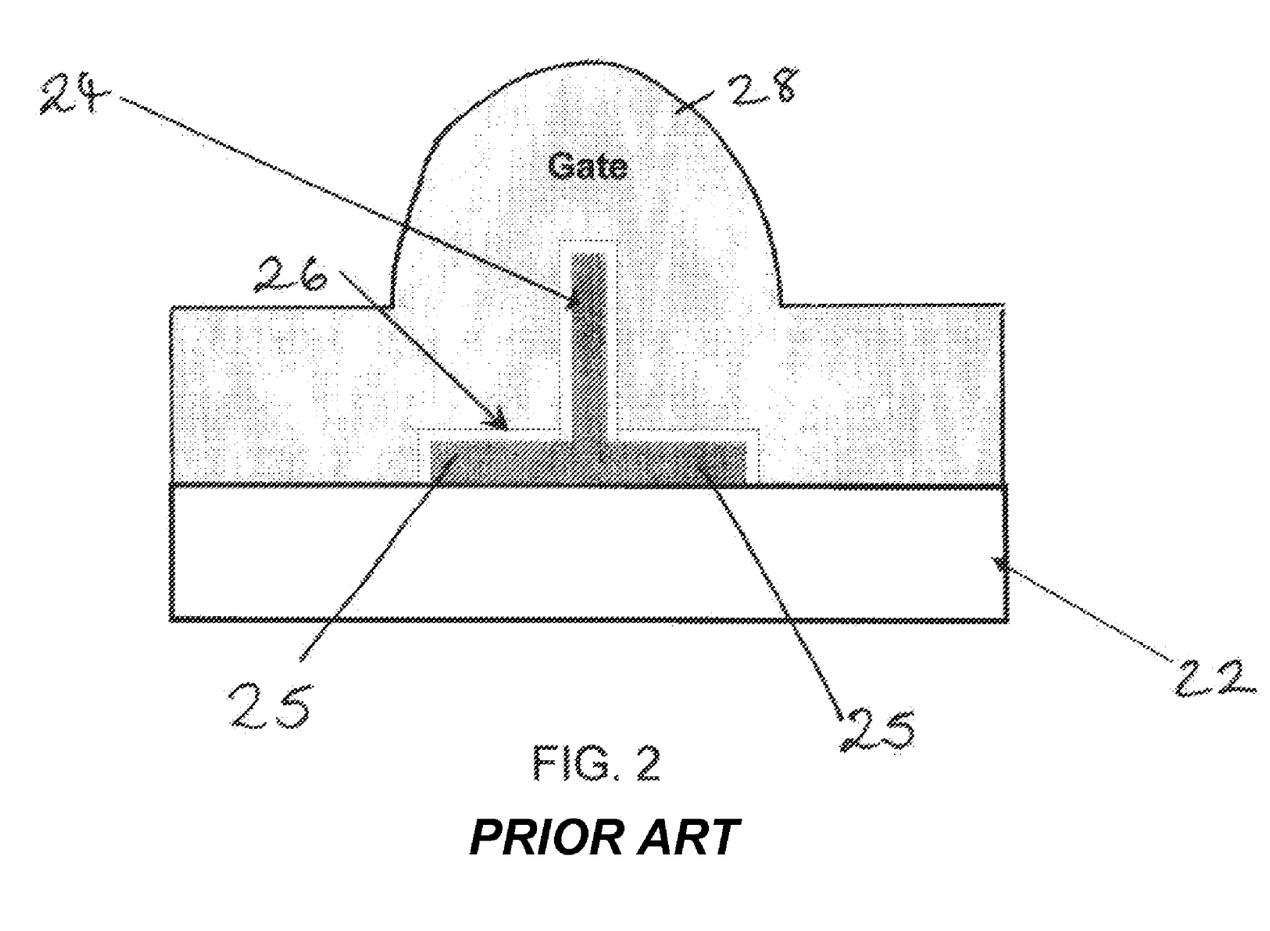
FIG. 2 is a schematic cross-section diagram of a portion of a known ITFET device.

An ITFET device has been developed which is a FinFET-type device with lateral extensions at the bottom of the fin so as to provide active thin body devices in the unused regions between the fins which increases the current drive compared to a FinFET device. A simplified cross-section of part of an ITFET device is shown in FIG. 2. The fin 24 and lateral extensions 25 form an inverted T shaped channel structure providing horizontal and vertical channels which are controlled by multiple contiguous gate segments: gate 28 overlies the fin 24 and a gate dielectric 26. Thus, an ITFET device is a multi gate device combining vertical and planar thin body structures within a single device. More details of the ITFET device can be found in US patent application no. 2007/050317 and an article entitled 'Inverted T channel FET (ITFET)—Fabrication and Characteristics of Vertical-Horizontal, Thin Body, Multi-Gate, Multi-Orientation Devices, ITFET SRAM Bit-cell operation. A Novel Technology for 45 nm and Beyond CMOS', by L. Mathew et al, Electron Devices Meeting, 2005. IEDM Technical Digest. IEEE International 5-7 Dec. 2005, pages 713-716.

In order not to compromise device performance, the inverted T shaped channel structure needs to be patterned reliably and repeatedly which is a challenge particularly since the structure has eight corners. Currently, as discussed in the above two documents, the lateral extensions of the inverted T shaped channel structure of the ITFET device is manufactured by a timed etch. However, generally, a timed etch process (i.e. a main etch process that is performed for a predetermined time) does not offer much control and uniformity in a manufacturing environment. In other words, with the current process, the thickness of the horizontal channel provided by the lateral extensions is hard to control reliably and uniformly.

Thus, there is therefore a need for an improved method of forming an ITFET device.

SUMMARY

The present invention provides a method of forming an inverted T shaped channel structure for an ITFET device, a method of forming an ITFET device and an ITFET device as described in the accompanying claims.

BRIEF DESCRIPTION OF THE DRAWINGS

A method of forming an inverted T shaped channel structure for an Inverted T channel Field Effect Transistor (ITFET) device, a method of forming an ITFET device and an ITFET device in accordance with the present disclosure will now be described, by way of example only, with reference to the accompanying drawings in which.

DETAILED DESCRIPTION OF THE DRAWINGS

In the description that follows and in FIGS. 3-8, certain regions are identified as being of a particular material, conductivity and/or type. However, this is merely for convenience of explanation and not intended to be limiting. Those of skill in the art will understand based on the description given herein that various semiconductor materials can be used and that the doping of various regions of the device may be altered in order to obtain different device functions.

A method of forming an inverted T shaped channel structure for an Inverted T channel Field Effect Transistor ITFET device in accordance with an embodiment of the present disclosure will now be described with reference to FIGS. 3-8. Only part of the ITFET device is shown for simplicity.

Figure 3:
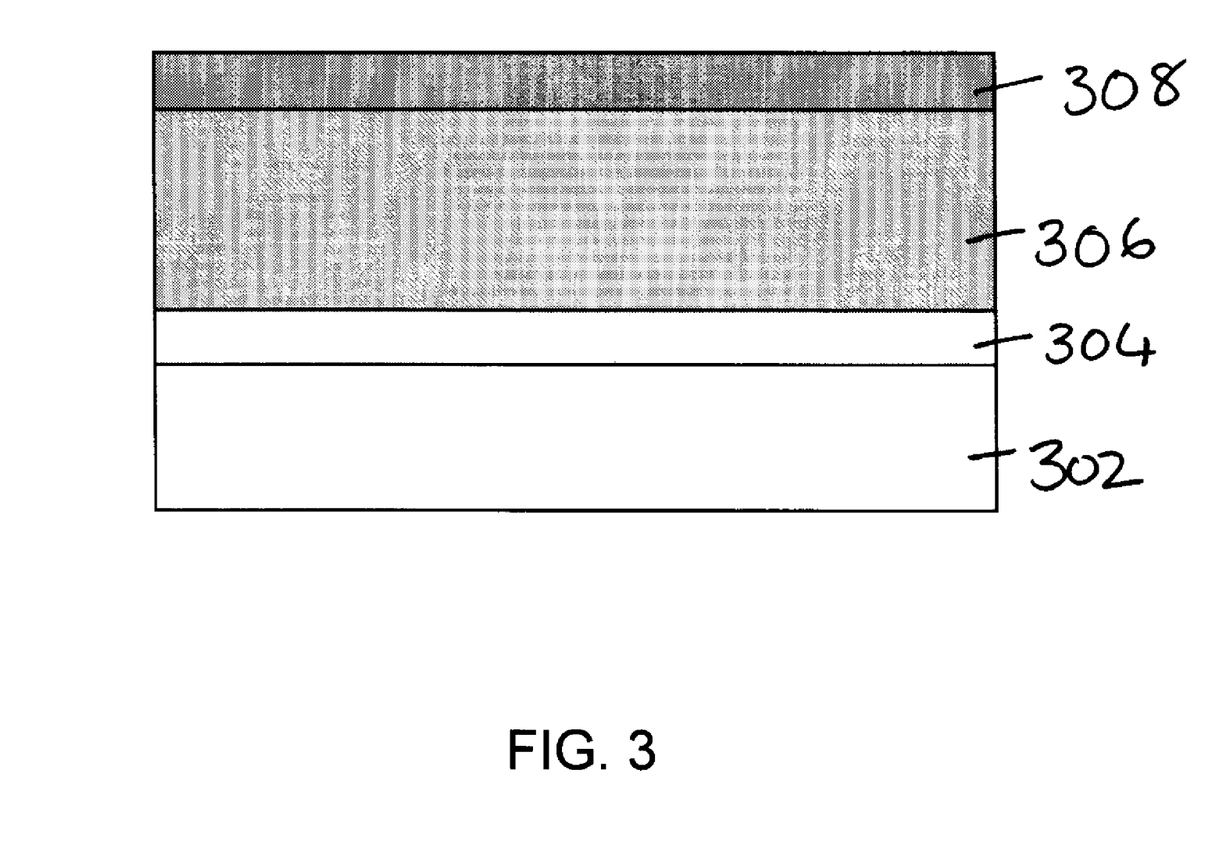
FIGS. 3-6 are schematic cross-section diagrams of a portion of an ITFET device during different stages of fabrication in accordance with an embodiment of the disclosure.

In FIG. 3, a first layer 304 of a first semiconductor material is formed over a semiconductor substrate 302. In an embodiment, semiconductor substrate 302 is a silicon oxide substrate (e.g. a SOI substrate) or a substrate with a silicon oxide layer, or other electrical insulator, at the top. The semiconductor substrate 302 may be formed from other materials. A second layer 306 of a second semiconductor material is formed over the first layer 304 and a mask 308, such as a hard mask or photoresist, is formed over the second layer 306. In an embodiment, mask 308 is a layer of silicon nitride but could be another material or combination of materials that is effective as an etch mask to the first and second semiconductor materials. Typically, the first layer 304 has a thickness in the range of 10-150 nm and the second layer 306 has a thickness in the range of 20-180 nm.

Figure 4:
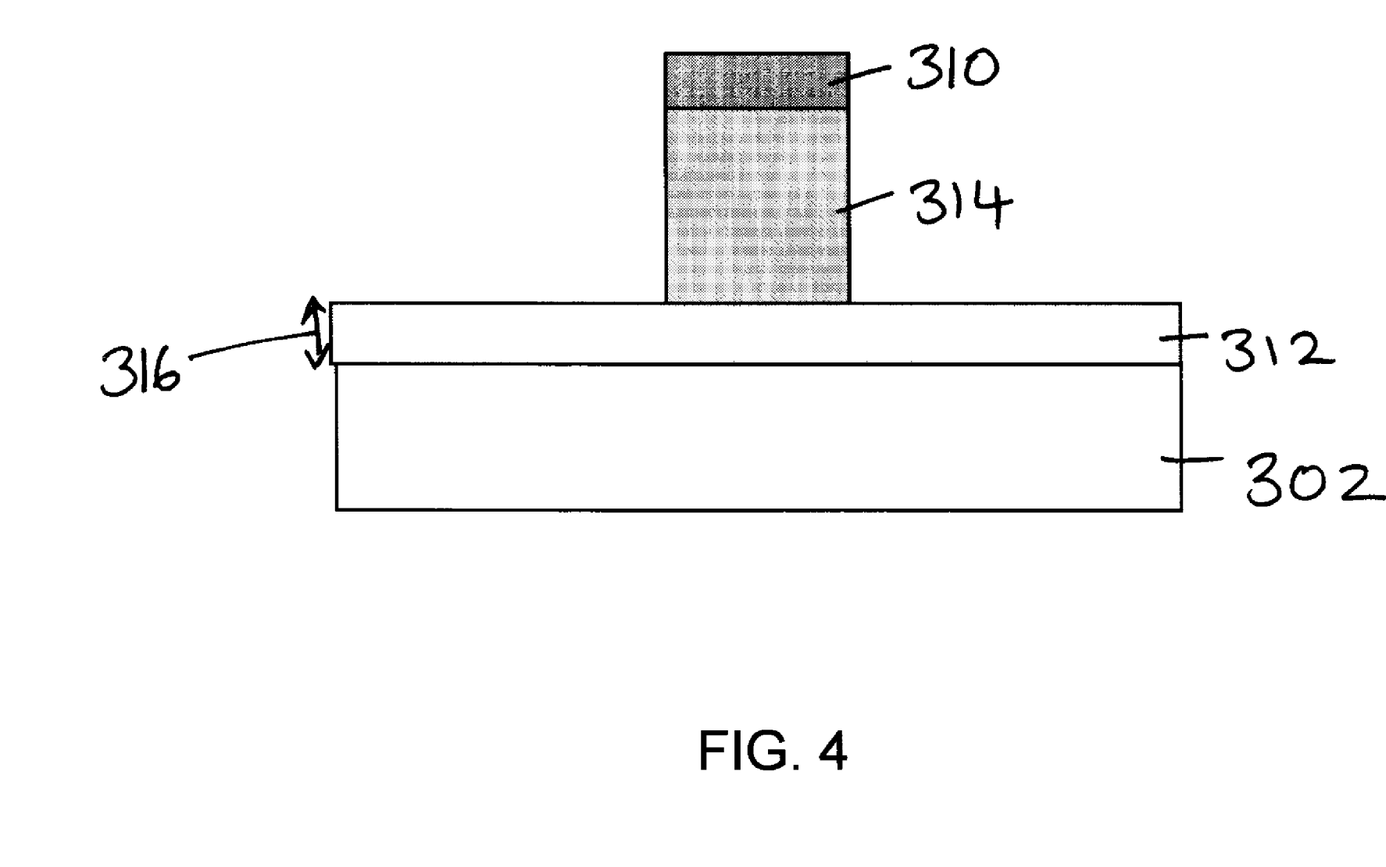

The silicon nitride layer 308 is patterned and etched to from a nitride cap 310 (see FIG. 4). A portion of the first 304 layer is then removed to provide a lateral layer 312 and a portion of the second layer 306 is then removed so as to form the vertical channel portion or active region or fin 314 of an inverted T shaped channel structure.

The first and the second semiconductor materials are selected such that the first semiconductor material has a rate of removal or etch rate which is less than the rate of removal or etch rate of the second semiconductor material during the same removal or etch conditions so that portions of the first layer and second layer are removed selectively according to the different rates of removal. The first semiconductor material and second semiconductor material may be selected from the following semiconductor materials: intrinsic semiconductor material, intrinsic semiconductor alloy, doped semiconductor material, doped semiconductor alloy and thus includes the following example semiconductor materials: silicon; silicon germanium alloy; silicon carbon alloy; silicon, germanium and carbon alloy; doped silicon; doped silicon germanium alloy; doped silicon carbon alloy; and doped silicon, germanium and carbon alloy. The doped semiconductor materials may be doped in situ or the dopants may be introduced for example by implantation. In an embodiment, the first and second semiconductor materials are monocrystalline but may instead be polycrystalline or amorphous.

Thus, by selecting the appropriate semiconductor materials for the first 304 and second 306 layers according to their different etch rates during the etch process, the lateral layer 312 and the vertical channel portion 314 of the inverted T shaped channel structure can be formed. Dry etching or wet etching processes may be used to remove the portions of the first 304 and second 306 layers.

In one example, the first semiconductor material is silicon germanium alloy and the second semiconductor material is silicon. The first SiGe layer 304 is grown epitaxially on the substrate 302 and the second Si layer 306 is grown epitaxially on the first SiGe layer 304. One of the following etchants is then used to etch selectively the first 304 and second 306 layers to form the lateral layer 312 and the vertical channel portion 314: a combination of carbon tetrafluoride $CF_4$, oxygen $O_2$, Argon Ar and nitrogen $N_2$. For example, a reactive ion plasma etch may be used to selectively etch the first SiGe layer 304 and the second Si layer 306 with gases: $CF_4$, $O_2$, Ar. The following combination of gases may also be used in an etch process: $CF_4/CH_2F_2/N_2/O_2/Ar$.

The etch rate of the SiGe of the first layer 304 depends on the concentration of germanium in the SiGe alloy: the higher the concentration of germanium, the greater the etch rate. When the concentration of silicon to germanium in the first layer 304 is in the ratio 8:2, the Si etch rate is 250 nm/min and a selectivity of over 100 can be readily achieved. This means that the second Si layer 306 is etched at a greater rate than the first SiGe layer 304.

In another example, the first semiconductor material is silicon Si and the second semiconductor material is silicon germanium SiGe alloy. The first Si layer 304 is grown epitaxially on the substrate 302 and the second SiGe layer 306 is grown epitaxially on the first Si layer 304. One of the following etchants is then used to etch selectively the first 304 and second 306 layers to form the lateral layer 312 and the vertical channel portion 314: nitric acid $HNO_3$, and a combination of hydrogen peroxide $H_2O_2$, hydrogen fluoride HF and acetic acid $CH_3COOH$. For example, a wet etch using a solution containing $HNO_3$, $H_2O_2$, and HF may be used to selectively etch the first Si layer 304 and second SiGe layer 306. A dry etch, for example, using the plasma etch processes described above may also be used.

The etch rate of the SiGe of the second layer 306 depends on the concentration of germanium in the SiGe alloy: the higher the concentration of germanium, the greater the etch rate. When the concentration of silicon to germanium in the second layer 306 is in the ratio 9:1, the selectivity to the SiGe alloy compared to Si is about 25. When the concentration of silicon to germanium in the second layer 306 is in the ratio 71:39, the selectivity to the SiGe alloy compared to Si is about 60. For both example concentrations of Ge, the second layer 306 is etched at a greater rate than the first layer 304 (but at a greater rate for the second example).

In principle, the selectivity could be maximised and hence the etch rate of the SiGe alloy increased by having the Ge concentration in the SiGe alloy greater than 50%. However, higher Ge concentrations (for example over 60%) may induce high mechanical stresses which could render the device inoperable because of the high level of defects or delamination effects. It will be appreciated that the range of Ge concentration is slightly different for the case when the first layer 304 is Si and the second layer 306 is SiGe compared to the case when the first layer 304 is SiGe and the second layer 306 is Si and depends on the etch chemistry.

In the examples described above, the first 304 and second 306 layers are grown epitaxially on the substrate 302, which may be a SOI wafer provided by a wafer vendor, such as SOITEC. Alternatively, the wafer vendor may provide an SOI wafer (substrate 302) with crystalline Si first layer 304 on the oxide layer 302 or an SOI wafer with crystalline SiGe first layer 304 on the oxide layer 302. The second layer 306 would then be grown epitaxially on the pre-existing first layer 304 provided by the wafer vendor.

In another example, the first semiconductor material comprises at least two semiconductor materials and the second semiconductor material comprise the same at least two semiconductor materials but in different concentrations to that of the first semiconductor material. For example, the first semiconductor material is silicon germanium alloy with 10% Ge concentration and the second semiconductor material is silicon germanium alloy with 40% Ge concentration and the solution $HNO_3$ is used in the etch process. In another example, the first semiconductor material is silicon germanium alloy with 30% Ge concentration and the second semiconductor material is silicon germanium alloy with 10% Ge concentration and the solution $CF_4/O_2/N_2$ is used in the etch process.

Other examples include: the first semiconductor material is Si and the second semiconductor material is any one of SiC, Si/Ge/C, doped SiC, doped Si/Ge/C; the first semiconductor material is SiGe and the second semiconductor material is any one of SiC, Si/Ge/C, doped SiC, doped Si/Ge/C; the first semiconductor material is SiC and the second semiconductor material is any one of SiC (with different concentrations of C to the first semiconductor material), Si/Ge/C, doped SiC, doped Si/Ge/C; the first semiconductor material is Si/Ge/C and the second semiconductor material is any one of SiC, Si/Ge/C (with different concentrations of C and Ge to the first semiconductor material), doped SiC, doped Si/Ge/C; or any other suitable combinations of first and second semiconductor materials. The appropriate etchants (wet or dry) are selected in order to achieve selective etching of the first and second semiconductor materials.

More information concerning selective etch processes can be found in the following articles: "Impact of Tunnel Etching Process on Electrical Performance of SON devices", by V.

Caulet et al, Japanese Journal of Applied Physics, vol. 44, no. 7B, p. 5795-98, 2005; and "Silicon-on-Nothing (SON)—an innovative process for advanced CMOS" by Jurczak, M.; Skotnicki, T.; Paoli, M.; Tormen, B.; Martins, J.; Regolini, J. L.; Dutartre, D.; Ribot, P.; Lenoble, D.; Pantel, R.; Monfray, S published in IEEE Transactions on Electron Devices, vol. 47, Page(s): 2179-2187, 2000.

The subsequent process steps follow the conventional method of forming an ITFET.

Figure 5:
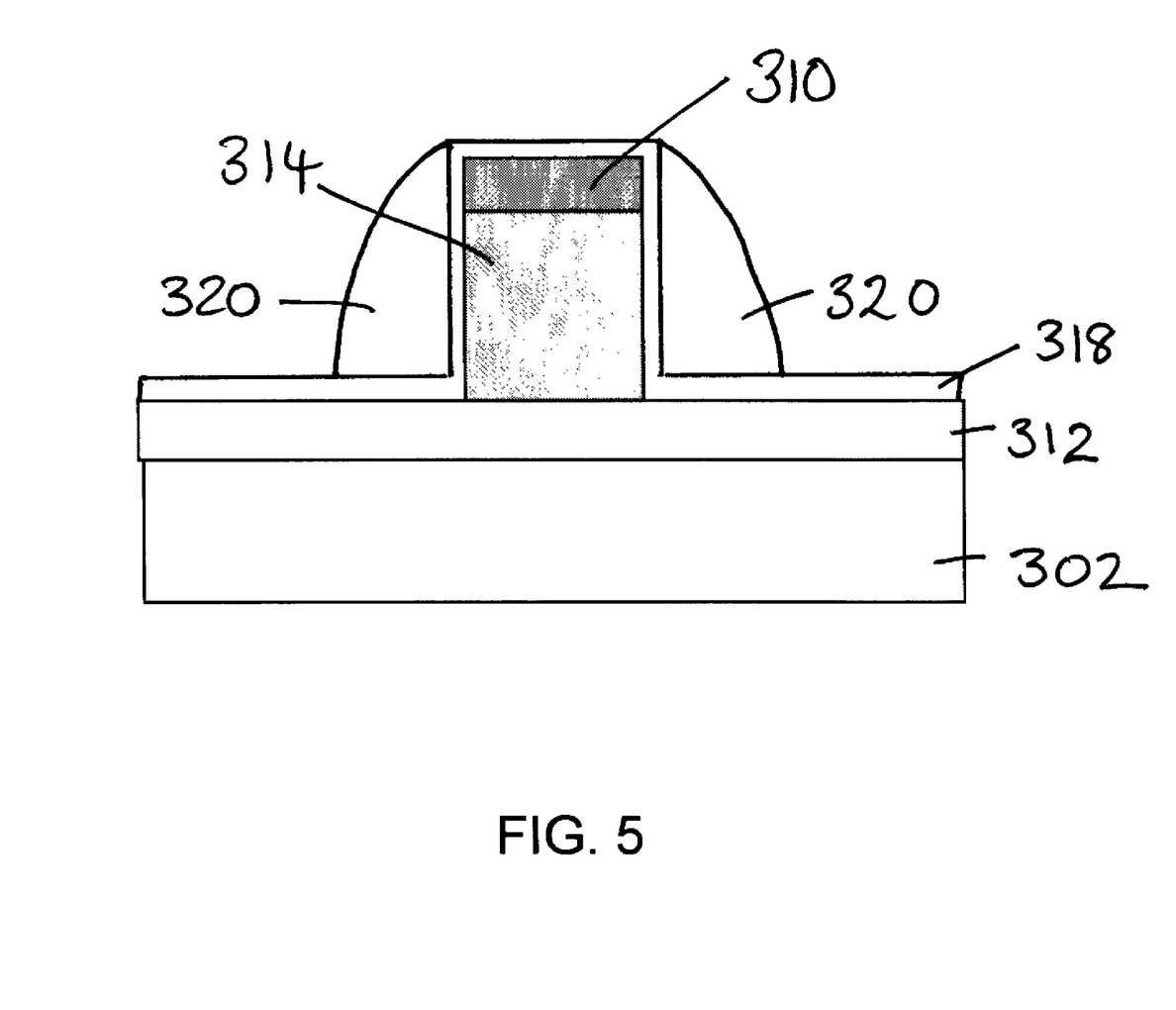

Referring now to FIG. 5, a liner 318 is then formed over lateral layer 312, nitride cap 310 and vertical channel portion 314. Liner 318 may be silicon oxide that is thermally grown or deposited. Sidewall spacer 320 is then formed on the sidewalls of vertical channel portion 314. In a preferred embodiment, sidewall spacer 320 is formed of silicon nitride but could be formed of another material that can function as an etch mask.

Figure 6:
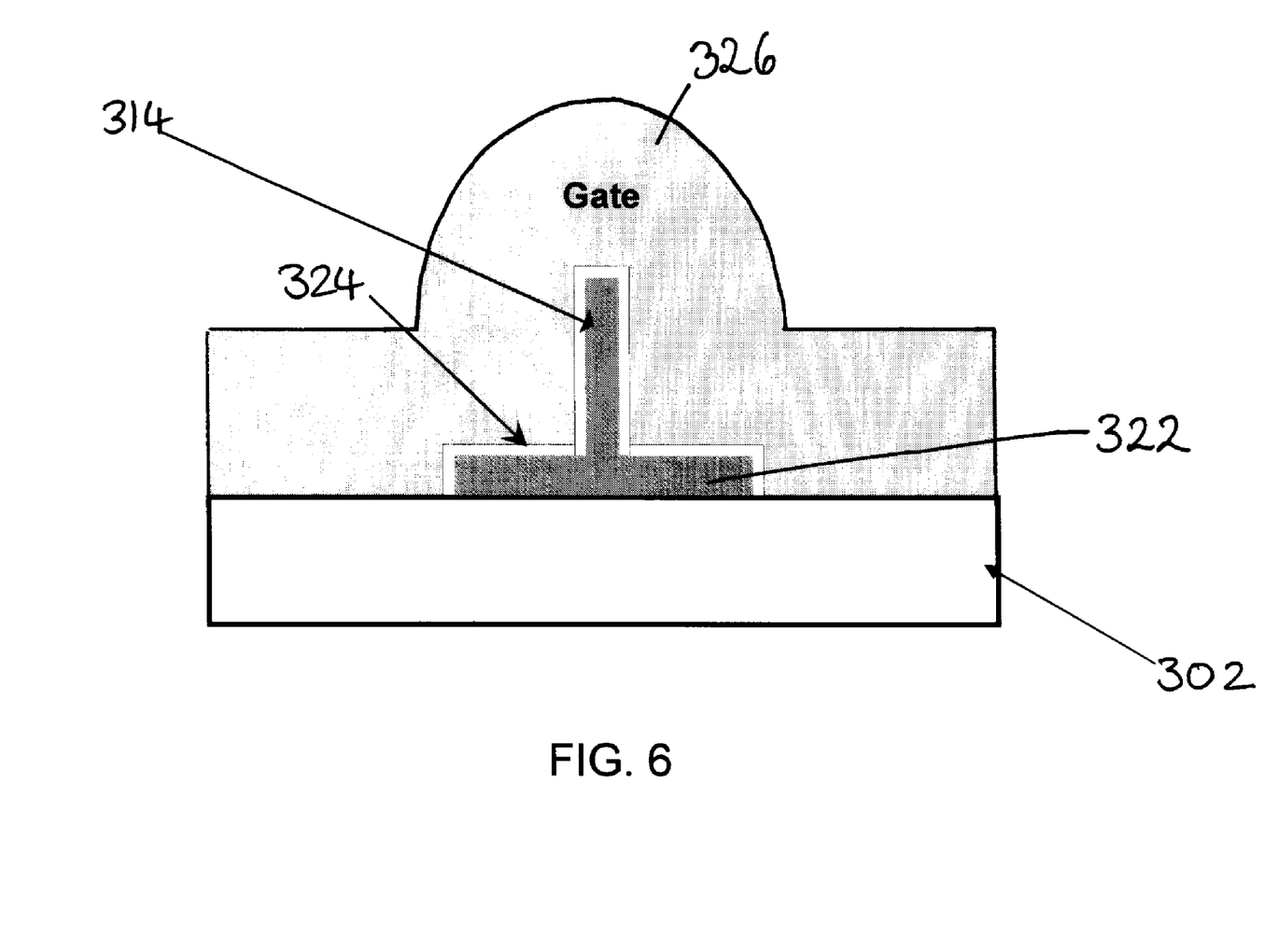

A portion of the lateral layer 312 is then removed using sidewall spacer 320 as a mask and an etching process so as to form horizontal channel portion or horizontal active region 322 of the ITFET device, as shown in FIG. 6. Thus, the width of the horizontal channel portion 322 is determined by the width of the sidewall spacer 320. Sidewall spacer 320, liner 318 and nitride cap 310 are then removed. A gate dielectric 324 is formed over the horizontal channel portion 322 and vertical channel portion 314 and then a gate 326 is formed over the dielectric gate 324. In an embodiment, the gate dielectric 324 is formed by a high temperature growth of silicon oxide. Other dielectric materials, such as metal oxides $HfO_2$ or $ZrO_2$, or any suitable high-k dielectric material, may alternatively be used. The gate 326 may be formed of a conductive material such as polysilicon or polysilicon on metal. The source and drain regions 328 are formed in conventional fashion as for a FinFET device.

Figure 7:
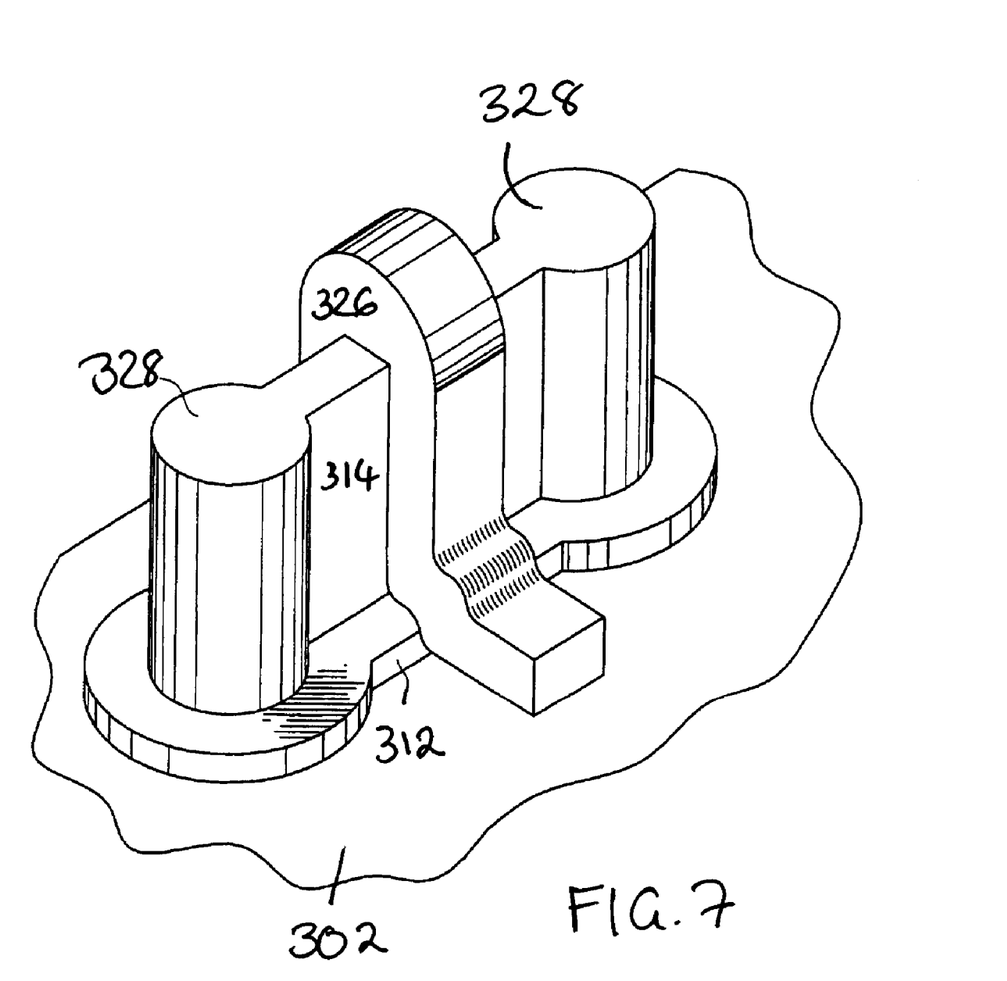
FIG. 7 is a top view of part of the ITFET device of FIG. 6.

FIG. 7 is a top perspective view of part of the ITFET device of FIG. 6 (but not showing the gate dielectric 324 separately) and shows source/drain regions 328 on either side of the gate 326 and formed over the semiconductor substrate 302. In the example shown in FIG. 7, the source/drain regions 328 are formed over part of the lateral layer 312.

In an ITFET device comprising a plurality of 'fins' or inverted T shaped channel structures, each of the plurality of 'fins' are formed in the same ways as described above.

The inverted T shaped channel structure of an ITFET device has eight corners. When the corners are pointed or not rounded, premature inversion can take place in the convex corner regions with the result that different parts of the ITFET device are switched on at different gate voltages. Acute concave corners are likely to suffer from deferred onset of inversion. In order to avoid premature or deferred inversion at the corners and to provide the same inversion properties along the length of the ITFET device, it is desirable to have rounded active corners on the vertical channel portion 314 and the horizontal channel portion 322 of the inverted T shaped channel structure.

In an embodiment of the disclosure, one of the first and second semiconductor materials is selected to be an intrinsic semiconductor alloy comprising at least a first semiconductor and a second semiconductor, with the concentration of the second semiconductor increasing as a distance from the junction between the first 304 and second 306 layers increases to a predetermined distance after which the concentration of the second semiconductor is constant. By varying the concentration of the second semiconductor as a function of distance from the junction between the first 304 and second 306 layers, desired and relatively precise corner rounding can be engineered.

Figure 8:
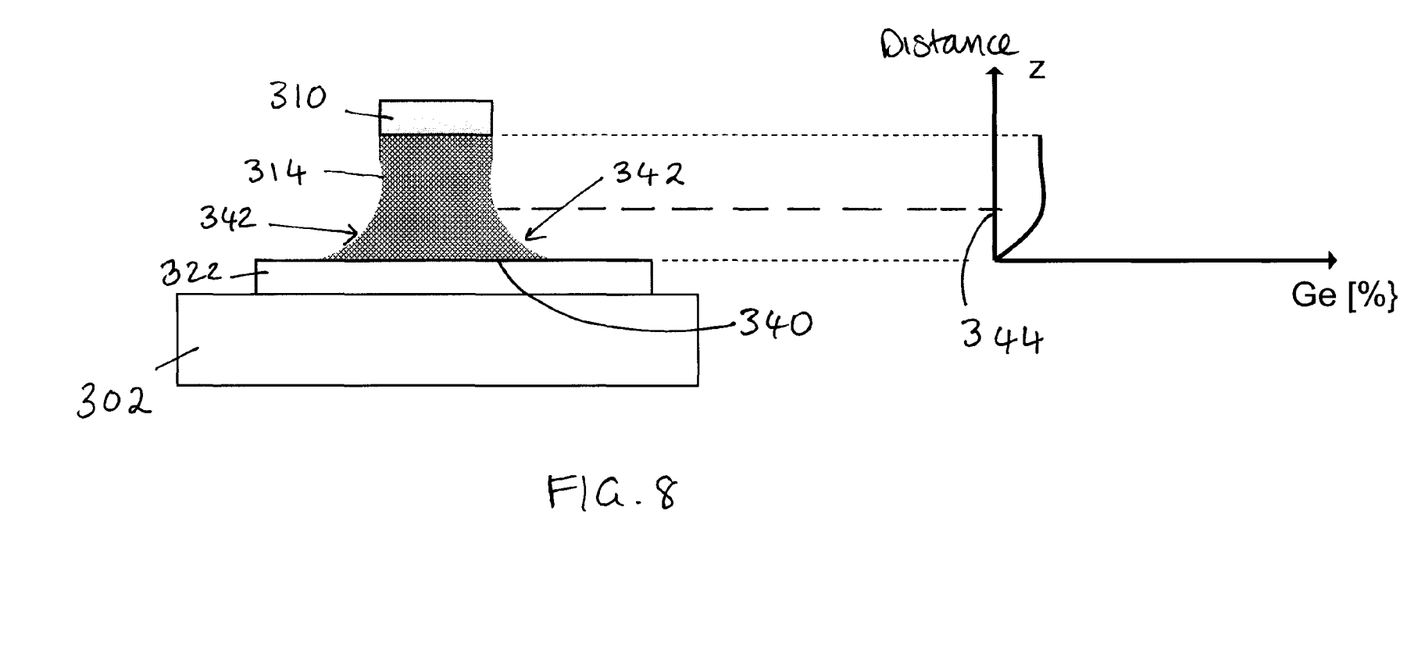
FIG. 8 is a schematic cross-section diagram of a portion of a partly fabricated ITFET device showing rounding of active corners of the inverted T shaped channel structure in accordance with an embodiment of the disclosure.

FIG. 8 shows the corner rounding at 342 in an example where the first layer 304 is Si and the second layer 306 is SiGe. The graph in FIG. 8 shows how the concentration of Ge in the second layer 306 (which forms the vertical channel portion 314) varies with distance z from the junction 340 between the first 304 and second 306 layers. The Ge concentration in the second semiconductor material is varied when the second SiGe layer 306 is formed by epitaxial growth in accordance with well known processes.

More precise corner rounding can be achieved due to the fact that the rate of removal of the second SiGe layer 306 is determined by the local concentration of Ge and the corner rounding is achieved by the increasing Ge concentration as the distance from the Si/SiGe junction increases until a predetermined distance is reached at 344 where the Ge concentration is kept constant for the upper part of the vertical channel portion 314. In this way a more precise corner rounding can be engineered. The curvature of radius of the rounded convex and concave corners can be anywhere between 2-15 nm. The distance from the Si/SiGe junction to 344 may be in the range 3-30 nm.

In an embodiment where the first semiconductor layer 304 is a SiGe layer and the second semiconductor layer 306 is a Si layer, the concentration of Ge in the first SiGe semiconductor layer 304 decreases from the bottom of the SiGe layer 304 towards the top of the SiGe layer 304 adjacent the junction with the second Si layer 306.

Typically, the percentage of Ge used in the SiGe material is 5-50%.

Since the selectivity of the selective removal of portions of the first 304 and second 306 layers can be controlled by selecting the appropriate first and second semiconductor materials for the first 304 and second 306 layers, the thickness 316 of the lateral layer 312 can be controlled more precisely than a timed etch process. Since the horizontal channel portion of the ITFET device is formed from the lateral layer 312, the thickness of the horizontal channel portion or horizontal active area of the ITFET device can therefore be controlled more precisely (e.g. within a few nanometers) than a timed etch process. Typically, the horizontal channel portion of the ITFET has a thickness in the range of 2-50 nm.

By having a graded concentration of a semiconductor alloy which forms one of the first and second layers which is graded away from the junction between the first and second layers, well controlled rounding of the active corners of the inverted T shaped channel structure can be provided. As discussed above, corner rounding avoids premature or deferred inversion in the corner regions. Since well controlled rounding of the corners can be obtained by the above described graded method in accordance with an embodiment of the invention, the threshold voltage Vt can be selected according to the degree of rounding and is kept the same in all parts of the ITFET device so that proper operation of the ITFET device can be achieved.

Thus, in summary, the method in accordance with the present disclosure provides a highly robust and manufacturable method of producing the inverted T channel shaped structure of an ITFET device with the benefit of mobility enhancement. In an embodiment which provides for corner rounding, the method in accordance with the embodiment provides convenient corner rounding and convenient adjusting of the threshold voltage.

In the foregoing specification, the invention has been described with reference to specific examples of embodiments of the invention. It will, however, be evident that various modifications and changes may be made therein without departing from the broader scope of the invention as set forth in the appended claims.

The invention claimed is:

1. A method of forming an inverted T shaped channel structure having a vertical channel portion and a horizontal channel portion at a bottom of the vertical channel portion for an Inverted T channel Field Effect Transistor ITFET device, the method comprising:
   providing a semiconductor substrate;
   providing a first layer of a first semiconductor material over the semiconductor substrate;
   providing a second layer of a second semiconductor material over the first layer;
   etching the first layer and the second layer, the first and the second semiconductor materials being selected such that for same etch conditions the first semiconductor material has an etch rate which is less than an etch rate of the second semiconductor material and an etch rate across the second layer increases as a distance from a junction between the first and second layers increases to a predetermined distance after which the etch rate of the second semiconductor layer is constant, wherein during the etching, portions of the first layer and the second layer are removed selectively according to the different etch rates so as to provide a lateral layer over the semiconductor substrate and the vertical channel portion of the inverted T shaped channel structure with rounded corners at a junction between the vertical channel portion and the lateral layer; and
   removing a portion of the lateral layer so as to provide the horizontal channel portion of the inverted T shaped channel structure.

2. A method according to claim 1, wherein the first semiconductor material and second semiconductor material are selected from the following semiconductor materials: intrinsic semiconductor material, intrinsic semiconductor alloy, doped semiconductor material, doped semiconductor alloy.

3. A method according to claim 1, wherein the first semiconductor material and second semiconductor material are selected from the following semiconductor materials: silicon; silicon and germanium alloy; silicon and carbon alloy; silicon, germanium and carbon alloy; doped silicon; doped silicon and germanium alloy; doped silicon and carbon alloy; and doped silicon, germanium and carbon alloy.

4. A method according to claim 1, wherein the first semiconductor material comprises at least two semiconductor materials and the second semiconductor material comprise the same at least two semiconductor materials but in different concentrations to that of the first semiconductor material.

5. A method according to claim 1, wherein etching selectively comprises etching the first and second layers using an etchant selected from the following:
   HNO3;
   a combination of H2O2, HF and CH3COOH;
   a combination of H2O2, HF and HNO3;
   a combination of CF4, O2 and Ar;
   a combination of CF4, O2 and N2; and
   a combination of CF4, CH2F2, N2, O2, and Ar.

6. A method according to claim 1, further comprising: forming a sidewall spacer on a first side and a second side of the vertical channel portion, wherein the removing a portion of the lateral layer comprises removing a portion of the lateral layer which is not covered by the sidewall spacer; and removing the sidewall spacer.

7. A method according to claim 1, wherein one of the first and second semiconductor materials is selected to be an intrinsic semiconductor alloy comprising at least a first semiconductor and a second semiconductor, with a concentration of the second semiconductor increasing as a distance from a junction between the first and second layers increases to a predetermined distance after which the concentration of the second semiconductor is constant.

8. A method according to claim 7, wherein the other one of the first and second semiconductor materials is selected to be one of the first semiconductor and an intrinsic semiconductor alloy comprising at least the first semiconductor and the second semiconductor, with a concentration of the second semiconductor in the other one of the first and second semiconductor materials being different to the concentration of the second semiconductor in the one of the first and second semiconductor materials.

9. A method according to claim 7, wherein the one of the first and second semiconductor materials is SiGe, the first semiconductor being Si and the second semiconductor being Ge.

10. The method of claim 7 further comprising:
    forming an Inverted T channel Field Effect Transistor ITFET device comprising:
    forming a gate dielectric over at least a first part of the horizontal channel portion and at least a first part of the vertical channel portion;
    forming a gate over the gate dielectric; and
    forming a source region and drain region over the semiconductor substrate either side of the gate.

11. A method according to claim 2, wherein the first semiconductor material comprises at least two semiconductor materials and the second semiconductor material comprise the same at least two semiconductor materials but in different concentrations to that of the first semiconductor material.

12. A method according to claim 2, wherein etching selectively comprises etching the first and second layers using an etchant selected from the following:
    HNO3;
    a combination of H2O2, HF and CH3COOH;
    a combination of H2O2, HF and HNO3;
    a combination of CF4, O2 and Ar;
    a combination of CF4, O2 and N2; and
    a combination of CF4, CH2F2, N2, O2, and Ar.

13. A method according to claim 3, wherein etching selectively comprises etching the first and second layers using an etchant selected from the following: HNO3; a combination of H2O2, HF and CH3COOH; a combination of H2O2, HF and HNO3; a combination of CF4, O2 and Ar; a combination of CF4, O2 and N2; and a combination of CF4, CH2F2, N2, O2, and Ar.

14. A method according to claim 4, wherein etching selectively comprises etching the first and second layers using an etchant selected from the following: HNO3; a combination of H2O2, HF and CH3COOH; a combination of H2O2, HF and HNO3; a combination of CF4, O2 and Ar; a combination of CF4, O2 and N2; and a combination of CF4, CH2F2, N2, O2, and Ar.

15. A method according to claim 2, further comprising:
    forming a sidewall spacer on a first side and a second side of the vertical channel portion, wherein the removing a portion of the lateral layer comprises removing a portion of the lateral layer which is not covered by the sidewall spacer; and removing the sidewall spacer.

16. A method according to claim 4, further comprising:
    forming a sidewall spacer on a first side and a second side of the vertical channel portion, wherein the removing a portion of the lateral layer comprises removing a portion of the lateral layer which is not covered by the sidewall spacer; and removing the sidewall spacer.

17. A method according to claim 2, wherein one of the first and second semiconductor materials is selected to be an intrinsic semiconductor alloy comprising at least a first semiconductor and a second semiconductor, with a concentration of the second semiconductor increasing as a distance from a junction between the first and second layers increases to a predetermined distance after which the concentration of the second semiconductor is constant.

18. A method according to claim 4, wherein one of the first and second semiconductor materials is selected to be an intrinsic semiconductor alloy comprising at least a first semiconductor and a second semiconductor, with a concentration of the second semiconductor increasing as a distance from a junction between the first and second layers increases to a predetermined distance after which the concentration of the second semiconductor is constant.

19. A method according to claim 6, wherein one of the first and second semiconductor materials is selected to be an intrinsic semiconductor alloy comprising at least a first semiconductor and a second semiconductor, with a concentration of the second semiconductor increasing as a distance from a junction between the first and second layers increases to a predetermined distance after which the concentration of the second semiconductor is constant.

20. A method according to claim 8, wherein the one of the first and second semiconductor materials is SiGe, the first semiconductor being Si and the second semiconductor being Ge.

* * * * *